United States Patent [19]

Tomozawa et al.

[11] 3,855,112

[45] Dec. 17, 1974

[54] METHOD OF MANUFACTURING INTERCONNECTION SUBSTRATE

[75] Inventors: Akihiro Tomozawa, Tokyo; Kensuke Nakata, Tokorozawa; Akira Kikuchi; Takashi Agatsuma, both of Tokyo, all of Japan

[73] Assignee: Hitachi, Ltd., Tokyo, Japan

[22] Filed: Jan. 7, 1974

[21] Appl. No.: 431,556

[30] Foreign Application Priority Data

Jan. 12, 1973 Japan .................. 48-5979

[52] U.S. Cl. .................. 204/15, 29/625, 29/588, 156/3, 156/17

[51] Int. Cl. ....... C23b 5/48, B41m 3/08, B01j 17/00

[58] Field of Search ........ 204/15; 29/588, 590, 591, 29/625, 628, 629, 627; 156/3, 8, 17, 22

[56] References Cited

UNITED STATES PATENTS

| | | | |
|---|---|---|---|
| 3,304,595 | 2/1967 | Sato et al. | 29/591 |
| 3,566,457 | 3/1971 | Engeler | 29/588 |
| 3,579,815 | 5/1971 | Gentry | 29/590 |
| 3,634,203 | 1/1972 | McMahon | 204/15 |
| 3,741,880 | 6/1973 | Shiba | 204/15 |

*Primary Examiner*—T. M. Tufariello
*Attorney, Agent, or Firm*—Craig & Antonelli

[57] ABSTRACT

A method of manufacturing an interconnection substrate, includes the steps of forming the first and second conductor layers of metals which have good ohmic contact and bonding properties on a substrate and each of which can be etched without corroding the other. A thin part of the upper surface of the second metal conductor layer is oxidized to form a porous film and a photoresist film having predetermined pattern is formed on the porous film. Those parts of the porous film and the second layer which are not covered with the photoresist film are etched and the photoresist film is removed. The entire surface of the remaining second metal portions is anodized by employing the first metal layer as an electrode, to form a porous metal oxide film. An additional anodization is effected to form a non-porous metal oxide film at the boundary between the last-mentioned porous film and the interconnection metal portions. Then, a CVD (chemical vapor deposition) film is deposited on the resultant substrate.

10 Claims, 8 Drawing Figures

METHOD OF MANUFACTURING INTERCONNECTION SUBSTRATE

CROSS REFERENCES TO RELATED APPLICATIONS

This application relates to subject matter described in U.S. Patent Application Ser. No. 431,488 filed on even date herewith by the applicants of the present application and assigned to the assignee of the present application entitled "Method of Forming Insulating Film on Interconnection Layer" which relates to Japanese priority application No. 5973/73 filed in Japan on Jan. 12, 1973.

BACKGROUND OF THE INVENTION

The present invention relates to a method of manufacturing an interconnection substrate.

In general, in integrated circuits and the like, in order to prevent metal interconnection portions of aluminum or the like from being corroded by water or the like after the formation of the interconnections, enhancement of the moisture resistance has been achieved by forming a protective film of, for example, a CVD (Chemical Vapor Deposition) on the surface of the aluminum interconnection portions.

It has been discovered that shoulder portions of an aluminum interconnection portion form sharp corners and that the CVD film to be formed on the upper surface of the aluminum interconnections does not have a uniform thickness and is formed to be extremely thin in the vicinity of the corners of the interconnection portions. As a result, pinholes are liable to appear, so that there is the disadvantage that water or the like penetrates into the CVD film to corrode the aluminum interconnection portions, giving rise to disconnection problems.

In order to prevent the generation of pinholes, when the CVD film is thickly formed, there is the disadvantage that, since the coefficients of thermal expansion of the semiconductor substrate and the CVD film differ, cracks are caused in the CVD film by thermal stresses due to heat generated during the generation of the interconnection substrate.

In a method of forming multi-layer interconnections hitherto proposed, moisture resistance has been provided in such a way that the CVD film is formed evenly on the surface of the interconnection portions, and that the surface of the interconnection portions is thinly anodized to form a metal oxide film. In more detail, in the method of forming multi-layer interconnections, the upper surface of an aluminum layer of the first layer is thinly anodized to form an alumina film, and then, an etching treatment is carried out to gradually shape the upper surface ends and the sides of the interconnection portions of the first layer, so that an insulating film and interconnection portions of the second layer may be uniformly formed on the upper surface of the interconnection portions of the layer so that any short-circuiting and disconnection problems may thus be prevented.

Where the above method is applied to the manufacture of an interconnection substrate, the alumina film is formed only on the upper surface of the aluminum interconnection portions, and the sides of the aluminum interconnection portions are in the state in which aluminum is exposed. The CVD film itself has no satisfactory moisture resistance, and moreover, the CVD film is inevitably formed somewhat thinly at the side portions of the interconnections, so that the aluminum interconnection portions are corroded from their side portions by water or the like. Also, when anodizing the respective interconnection portions on the substrate, in order to simultaneously anodize all the aluminum interconnection portions, it is necessary to partially short-circuit the respective aluminum interconnections, after the formation of the plurality of aluminum interconnection portions, which has led to the disadvantages of an inferior efficiency and an increase of the number of complicated steps.

In order to prevent the aluminum interconnection portions from being corroded from the sides, as illustrated in FIGS. 1A and B, the whole surface of the aluminum interconnection portion has been covered with a non-porous alumina film, to enhance the reliability of the interconnection portion against water and chemicals. This method provides a non-porous alumina film 2 acting as an insulator, at a part of the surface of an aluminum layer 1 as shown in FIG. 1A, with the aluminum layer 1 being anodized by employing the alumina film 2 as a mask, to form a porous alumina film 1a as shown in FIG. 1B. In this case, the aluminum layer beneath the non-porous alumina film 2 is masked by the alumina film 2 and hence, it is not anodized, and an aluminum interconnection portion 1b is formed. By employing a predetermined electrolyte, e.g., anoxalic acid, for the anodization, a non-porous alumina film 2a is formed on the side portions of the aluminum interconnection portion.

Since the above method requires that the evaporated and formed aluminum layer by completely anodized, it has had the disadvantages that a considerable amount of time is required and that not all of the portions are anodized.

OBJECTS OF THE INVENTION

The present invention has as an object the provision of a method in which the surface of interconnection portions of the uppermost layer of a multi-layer interconnection substrate is oxidized to form a metal oxide film, thus enhancing the moisture resistance of the interconnection substrate and enabling the manufacture of an interconnection substrate, so as to prevent deterioration of moisture-resisting protective film covering the uppermost layer interconnection portions.

BRIEF DESCRIPTION OF THE DRAWING

FIGS. 1A and 1B are views for explaining a prior-art method of forming a protective film of a metal oxide on the surface of an interconnection portion, respectively; while

DETAILED DESCRIPTION OF THE INVENTION

Figure 1A:
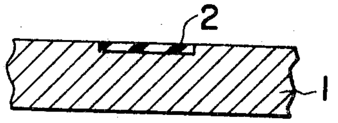
Figure 1B:
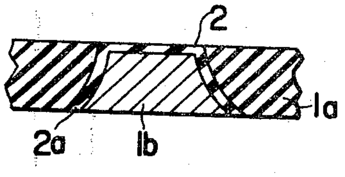
Figure 2A:
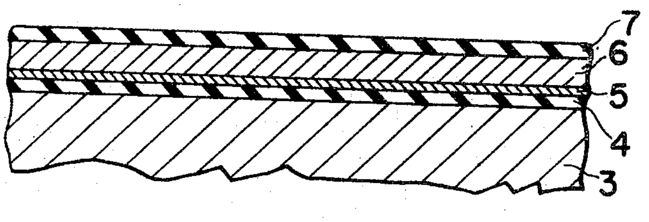
FIGS. 2A–2F are vertical sectional side views for explaining the steps for manufacturing an interconnection substrate in an embodiment of the method of manufacturing an interconnection substrate according to the present invention, respectively.

First, as shown in FIG. 2A, the primary conductor metal 5 is evaporated and formed on a protective film of silicon oxide $Si_3N_4$ or $SiO_2$-$P_2O_5$(or an underlying insulating film) 4 over a substrate (or an underlying conductor layer) 3, such as silicon, germanium, an intermetallic compound, or an insulator such as a ceramic or glass plate and further, an aluminum layer 6 to become the secondary conductor is evaporated and formed on the upper surface of the resultant substrate. As the primary conductor metal 5, it is advisable to select a metal, such as Ag, Cr-Ag, Cr, Ti, Mo or the like, which is not corroded during an etching treatment of the aluminum layer 6 and an oxide of aluminum as will be hereinbelow described and with which the other parts of the aluminum oxide etc. are not affected by an etching treatment of the primary conductor metal 5. Moreover, it is necessary to select a metal conductor which has good bonding properties and good ohmic contact with the metal selected as the secondary conductor metal. In this embodiment, Ag is used as the primary conductor metal 5.

Subsequently, the upper surface of the aluminum layer 6 is thinly oxidized by an anodization process, to form a porous alumina ($Al_2O_3$) film 7. As a method for thus forming the porous alumina ($Al_2O_3$) film 7 by oxidizing the aluminum (Al) layer 6, a 5% oxalic acid may be used as a treating solution in the anodization process. The anodization process is carried out for 60 minutes with an applied voltage of 1 volt using such a treating solution. As a result, a porous alumina film 7, 1,500 A thick, is formed on the layer 6.

Figure 2B:
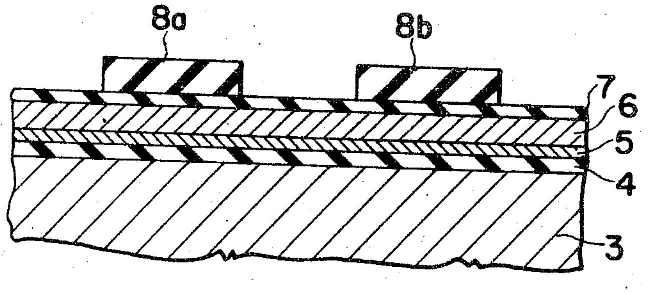

Subsequently, as shown in FIG. 2B, a photoresist film 8a, 8b is selectively formed on the porous alumina film 7 by a conventional deposition process, for example, the spinner method.

Figure 2C:
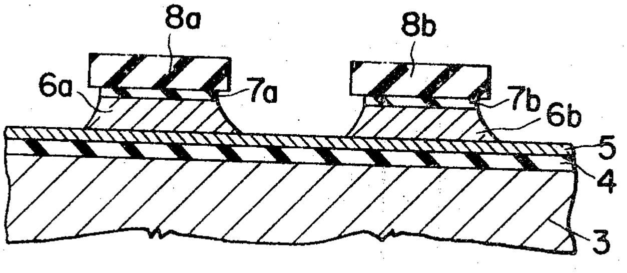

Then, an etching treatment is carried out using a suitable etchant and the photoresist film ***8a*, *8b* as a corrosion-proof mask, to etch and remove, as shown in FIG. 2C, those parts of the aluminum layer 6 and the alumina film 7 which are not masked with the photoresist film *8a*, *8b*. A suitable etchant may consist, for example, of mixed solution of phosphoric acid ($H_3PO_4$), acetic acid ($CH_3COOH$), water ($H_2O$), ammonium fluoride ($NH_4F$) and nitric acid ($HNO_3$), mixed in respective proportions of 760 cc, 150cc, 22–60 cc, and 30cc. With the porous alumina film 8 having an etching rate greater than the etching rate of the aluminum layer 7, with the volume of $NH_4F$ in the etchant within the above range of 20–60 cc, the etching rate ratio of the alumina layer 8 to the aluminum layer 7 can be from 2:1 to 3:1. Namely, for example, the etching rate of the etchant for aluminum layer 7 may be 1,000 A /min. while that for the porous alumina layer 8** is 2,500 A /min. The temperature of the solution may lie within a range of about 30°C to 50°C and is, preferably at 40°C.

In that case, since a metal which can be etched independently of the aluminum layer 6 of the secondary conductor metal is selected as the primary conductor metal 4, the difference of the etching rates of both the metals is large, and the primary conductor metal 4 is hardly corroded by the etching treatment solution of the aluminum layer 6. During the etching treatment, since the adherence force of the photoresist film ***8a*, *8b* to the alumina film 7 is strong and the alumina film 7 is the porous film, the etching rate of the alumina film 7 is larger than that of the aluminum layer 6, so that the alumina film 7 is not etched vertically, but that the alumina film *7a*, *7b* is subjected to side etching. The aluminum layer *6a*, *6b* on which the porous alumina film *7a*, *7b* is formed is accordingly exposed to an etchant by the side etching of the porous alumina film *7a*, *7b***, and is etched also at the ends of the upper surface into a shape having a gentle slope.

Figure 2D:
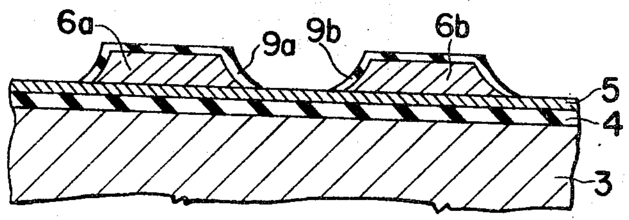

Subsequently, the photoresist film ***8a*, *8b* is removed by a photoresist removing solution, e.g., benzenesulfonic acid, whereupon a porous alumina film *9a*, *9b* is formed as shown in FIG. 2D by anodizing the entire surface of the aluminum layer *6a*, *6b* by employing the primary conductor metal 5 as an electrode. The conditions of the anodization treatment are the same as those described above. Also, in this case, there are selected electrolytic conditions under and the primary conductor metal with which the oxidizing rate of the primary conductor metal 5 is negligible as compared with that of the aluminum layer *6a*, *6b***.

Figure 2E:
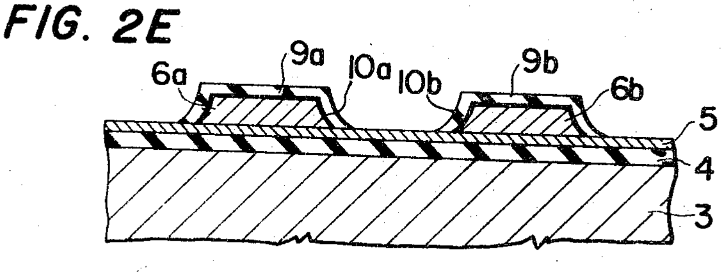

The porous alumina film ***9a*, *9b* can be easily formed thickly to protect the interconnection portions against mechanical external forces exerted thereon and contributes to the enhancement of the durability of the interconnection portions, but it does not have a sufficient moisture resistance in itself, so that anodization is carried out using a 5% ammonium tetraborate solution as an electrolyte, for 5 minutes at an applied voltage of 100 volts to form a non-porous alumina film *10a*, *10b* at the interface between the interconnection portion *6a*, *6b* and the porous alumina film *9a*, *9b* as shown in FIG. 2E. The thickness of the non-porous alumina film depends upon the applied voltage, with the increase in the thickness eventually saturating after a period of treatment. After about 5 minutes have elapsed, the non-porous aluminum film stops growing, i.e., it reaches a constant thickness. Therefore, it may be said that the thickness may be determined in accordance with the relationship 15A /volt applied. As a result, for an applied voltage of 100 volts, as described above, a non-porous alumina film 1,500 A thick will be formed. In this case, the non-porous alumina film *10a*, *10b* is formed so that very thin non-porous parts of the porous alumina film *9a*, *9b* under the respective pores are thickened. The non-porous film has extremely good moisture resistance and can further satisfactorily act as a protective film against chemicals, so that it effectively prevents the interconnection portions from being corroded. The alumina film to become the protective film of the interconnection portions has a dual structure consisting of the porous alumina film *9a*, *9b* and the non-porous alumina film *10a*, *10b*** whereby it can be thickly formed and becomes stable as a protective film.

Figure 2F:
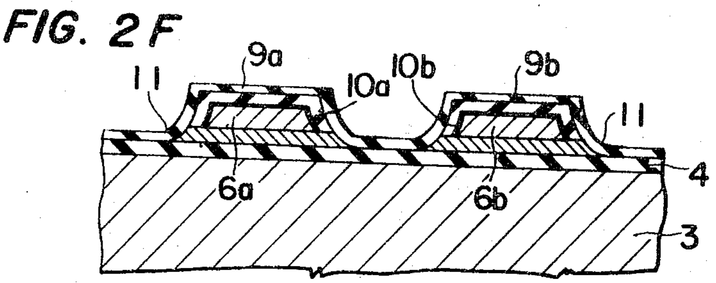

Subsequently, as shown in FIG. 2F, exposed portions of the primary conductor metal 5 are etched and removed by etching the Ag by nitric acid ($HNO_3$) or chromic acid ($CrO_3$) + sulfuric acid ($H_2SO_4$ or a potassium iodide (KI) + iodine (I) solution. Cu may be affected in the same way. Then, a CVD film 11 of $SiO_2$(0.5 to 0.8$\mu$ thick) is formed on the substrate 3 by thermally decomposing silane compounds, e.g., a monosilane at 400°C. During the etching treatment, an etchant is selected which can render the etching rate of the alumina film ***9a*, *9b* sufficiently small in comparison with that of the primary conductor metal 5. When forming the CVD film 11 on the surfaces of the interconnection portions (aluminum layer) *6a*, *6b* covered with the alumina protective film of the double structure, the CVD film 11 is formed over the interconnection portions *6a*, *6b* with a uniform thickness and gradual slope, since the interconnection portions *6a*, *6b* have their upper surface ends and sides formed with a gradual slope. The CVD film 11 at the bonding pad parts must be etched and removed in order to execute wire bonding and in this case, since the aluminum interconnection portions 6***a*, 6*b* are covered with the porous alumina film 9*a*, 9*b* and the non-porous alumina film 10*a*, 10*b*, they are not readily corroded by the etchant and, accordingly, are not easily subject to the secondary effect of the CVD film etching (discoloration of A*l*, etc.).

Although, in the foregoing embodiment, aluminum is employed as the secondary conductor metal evaporated and formed, the method is similarly applicable to alloys of aluminum besides the aluminum (such as an aluminum-silicon alloy of 2 to 3% by weight of Si) and similar effects are obtained.

The range of application of the method of manufacturing an interconnection substrate according to the present invention extends widely, and the method is applicable to aluminum interconnections of all transistors, diodes, ICs and LSIs and produces similar effects. For the manufacture of a multi-layer interconnection substrate, it is applicable to interconnection portions of all the layers. Further, it is a matter of course that the method of the present invention is applicable to a single layer interconnection and to a single electrode.

As set forth above, the method of manufacturing an interconnection substrate according to the present invention provides the evaporation of a first metal conductor layer on a substrate. A second metal conductor layer is formed, and the upper surface of the second metal conductor layer is thinly oxidized, to form a porous metal oxide film. An etching treatment is effected by employing a photoresist film formed on the metal oxide film as a mask to form interconnection portions. Thereafter, an anodization process is carried out with the first metal conductor layer being employed as an electrode. A protective film including a non-porous film is formed so as to cover the entire surface of the interconnection portions, so that, since the sides of the interconnection portions can also be covered with the metal oxide film, moisture resistance is greatly enhanced. Also, in that case, the full metal layer evaporated and formed need not be oxidized, in contrast to the prior art and only the surfaces of the interconnection portions need be oxidized. The working time can be shortened and the steps are simplified, and since the metal oxidation can be perfectly carried out, leakage current is preventable. Oxidation after the formation of the interconnection portions is easy, as stated above, so that the method of the present invention can also be applied for the manufacture of an interconnection substrate having a high degree of integration such as a MOS LSI. Further, the interconnection portions are formed by etching the metal layer having a metal oxide film, so that the upper surface ends and sides of the interconnection portions are formed with a gradual slope and that a moisture-resisting protective film such as a CVD film can consequently be formed on the interconnection portions have a uniform thickness with a smooth surface. The present invention, therefore, has merits such that pinhole deterioration of the CVD film is preventable and the interconnection portions are avoided from being corroded by water or the like.

We claim:

1. A method of manufacturing an interconnection arrangement on a substrate comprising the steps of:

a. forming a first metallic layer overlying the surface of a supporting substrate;

b. forming a second metallic layer on the surface of said first metallic layer;

c. shaping the side portions of said second metallic layer to have a gradually sloped surface;

d. forming a porous insulating film covering the entire exposed surfaces of said second metallic layer; and e. converting the surface portion of said second metallic layer facing said porous insulating film into a relatively thin, non-porous insulating layer which directly covers said second metallic layer and is disposed beneath said porous insulating film.

2. A method according to claim 1, wherein said step (c) comprises the step of selectively etching said second metallic layer with an etchant, the etching rate of which for said second metallic layer is considerably greater than that for said first metallic layer.

3. A method according to claim 2, wherein said first metallic layer is a layer of a metal selected from the group consisting of Ag, Cr-Ag alloy, Cr, Ti and Mo, and said second metallic layer is aluminum.

4. A method according to claim 2, wherein said step (d) comprises the step of forming a porous metallic oxide on the exposed surfaces of said second metallic layer.

5. A method according to claim 4, wherein said step (d) comprises anodically oxidizing the exposed surfaces of said second metallic layer to form said metallic oxide.

6. A method according to claim 5, wherein said second metallic layer is a layer of aluminum and said metallic oxide is porous alumina.

7. A method according to claim 4, wherein said step (e) comprises the step of anodizing the surface portion of said second metallic layer using an anodizing electrolyte which penetrates through said porous metallic oxide to form a non-porous metallic oxide.

8. A method according to claim 7, wherein said second metallic layer is a layer of aluminum, said porous metallic oxide is alumina, and said anodizing electrolyte is boric acid.

9. A method according to claim 1, further comprising the step of:

f. etching the exposed portions of said first metallic layer with an etchant, the etching rate of which relative to said first metallic layer is considerably greater than that for said porous insulating film.

10. A method according to claim 9, further comprising the step of:

g. forming a further insulating layer over the entire surface of said substrate.

* * * * *